United States Patent
Carlisi et al.

(10) Patent No.: US 7,423,870 B2
(45) Date of Patent: Sep. 9, 2008

(54) BLADE SERVER ASSEMBLY

(75) Inventors: James L. Carlisi, Raleigh, NC (US); Keith D. Richeson, Cary, NC (US); Steven R. Testa, Durham, NC (US); John K. Whetzel, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 11/282,269

(22) Filed: Nov. 18, 2005

(65) Prior Publication Data
US 2007/0115627 A1 May 24, 2007

(51) Int. Cl.
G06F 1/16 (2006.01)
(52) U.S. Cl. .................. 361/686; 713/170; 280/47.26; 710/303
(58) Field of Classification Search ............. 713/170, 713/310; 280/47.26, 5.514; 370/230, 386; 710/303, 104; 361/679–687, 724–727
See application file for complete search history.

(56) References Cited

U.S. PATENT DOCUMENTS

| | | | |
|---|---|---|---|
| 2,857,558 A | 10/1958 | Fiske | |
| 3,295,905 A | 1/1967 | Sisk et al. | |
| 6,027,186 A | 2/2000 | Liou | |
| 6,082,845 A | 7/2000 | Eizadkhah et al. | |
| 6,193,341 B1 | 2/2001 | Eizadkhah et al. | |
| 6,330,161 B1 | 12/2001 | Smith et al. | |
| 6,535,391 B2 | 3/2003 | Larsen et al. | |
| 6,771,499 B2 * | 8/2004 | Crippen et al. | 361/687 |
| 6,788,542 B2 | 9/2004 | Rumney | |
| 2005/0286221 A1 * | 12/2005 | Yamana et al. | 361/687 |
| 2006/0190484 A1 * | 8/2006 | Cromer et al. | 707/104.1 |
| 2007/0050644 A1 * | 3/2007 | Merkin | 713/300 |

* cited by examiner

Primary Examiner—Hung V Duong
(74) Attorney, Agent, or Firm—Thomas D. Fortenberry; Cynthia S. Byrd; Biggers & Ohanian, LLP

(57) ABSTRACT

A blade server assembly is disclosed that includes a blade server chassis, a blade server, and a support assembly connected with the blade server chassis and with the blade server so as to support the blade server substantially outside the blade server chassis. A method is also disclosed for maintaining a blade server installed in a blade server chassis that includes supporting the blade server substantially outside the blade server chassis through a support assembly connected with the blade server chassis and with the blade server.

3 Claims, 6 Drawing Sheets

BLADE SERVER ASSEMBLY

BACKGROUND OF THE INVENTION

1. Field of the Invention

The field of the invention is blade server assemblies and methods for maintaining a blade server installed in a blade server chassis.

2. Description of Related Art

The development of the EDVAC computer system of 1948 is often cited as the beginning of the computer era. Since that time, users have relied on computer systems to simplify the process of information management. Today's computer systems are much more sophisticated than early systems such as the EDVAC. Such modern computer systems deliver powerful computing resources to provide a wide range of information management capabilities through the use of computer software such as database management systems, word processors, spreadsheets, client/server applications, web services, and so on.

In order to deliver powerful computing resources, blade server maintenance personnel may design a computer system that utilizes blade servers installed in a blade server chassis. A blade server is a minimally-packaged computer motherboard that includes one or more computer processors, computer memory, storage, and network interface modules. Blade server maintenance personnel may install multiple blade servers in a blade server chassis to provide a scalable computer system in a relatively small physical space.

As any other computing device, a blade server requires periodic maintenance. Blade server maintenance personnel or other blade server maintenance personnel often performs routine maintenance on a blade server such as installing additional computer memory, swapping computer processors, inserting a daughter card into the motherboard, replacing the blade server entirely, and so on. Performing such maintenance is relatively simple when blade server maintenance personnel may conveniently access the blade server. Current blade server chassis, however, provide no physical support for a blade server during maintenance of the blade server. Maintenance personnel must locate a table or workbench on which to perform the blade server maintenance somewhere near or relatively far from the blade server chassis. Often limited space available in a computer server room may force maintenance personnel to set a blade server on the floor for maintenance—or attempt to support the blade server in some other awkward position. The physical arrangements for blade server maintenance in current art therefore are inconvenient and risk damage from awkward handling of blade servers.

SUMMARY OF THE INVENTION

A blade server assembly is disclosed that includes a blade server chassis, a blade server, and a support assembly connected with the blade server chassis and with the blade server so as to support the blade server substantially outside the blade server chassis. A method is also disclosed for maintaining a blade server installed in a blade server chassis that includes supporting the blade server substantially outside the blade server chassis through a support assembly connected with the blade server chassis and with the blade server.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Detailed Description

Figure 1:
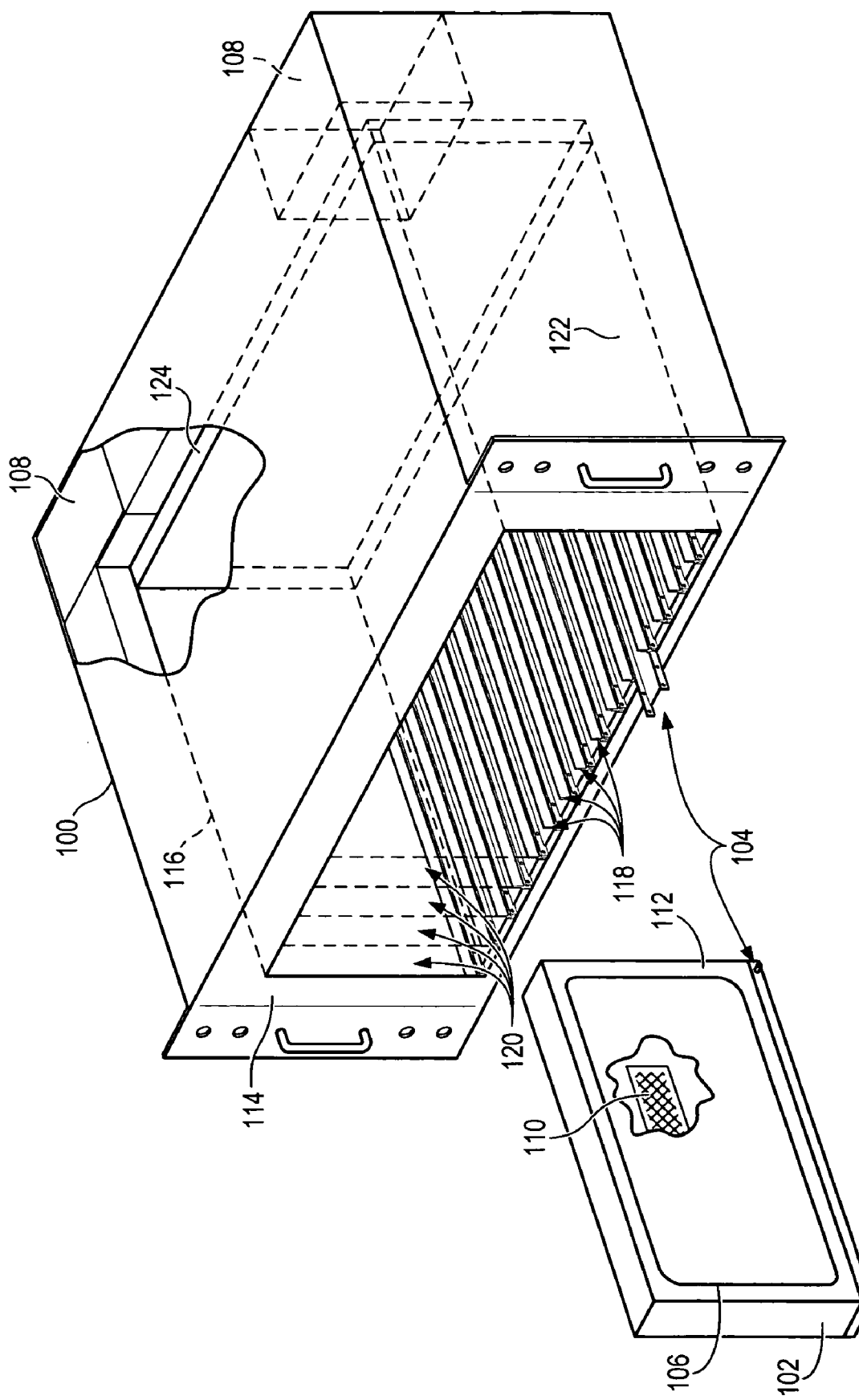
FIG. 1 sets forth a perspective view of an exemplary blade server assembly according to embodiments of the present invention.

Exemplary blade server assemblies and methods for maintaining a blade server installed in a blade server chassis according to embodiments of the present invention are described with reference to the accompanying drawings, beginning with FIG. 1. FIG. 1 sets forth a perspective view of an exemplary blade server assembly according to embodiments of the present invention. The example of FIG. 1 includes a blade server chassis (100), a blade server (102), and a support assembly (104) connected with the blade server chassis and with the blade server so as to support the blade server substantially outside the blade server chassis.

The blade server chassis (100) is computer hardware that houses and provides common power supply and air-cooling resources to one or more blade servers (102). Blade server chassis (100) includes power supply bays (108) for multiple power supply modules with load balancing and failover capabilities such as, for example, a hot-swappable power supply module with 1400-watt or greater direct current output. The redundant power supply configuration ensures that the blade server chassis (100) will continue to provide electrical power to the blade servers (102) if one power supply fails. Examples of blade server chassis (100) that may be improved according to embodiments of the present invention include the IBM eServer® BladeCenter™ Chassis, the Intel® Blade Server Chassis SBCE, the Dell™ PowerEdge 1855 Enclosure, and so on.

In the example of FIG. 1, the blade server chassis (100) also includes a backplane (124). The backplane (124) is a circuit board forming a computer bus that allows the flow of data between the blade server (102) and input/output devices such as, for example, network switches, monitors, keyboards, and so on. The backplane (124) connects to the blade server (102) through a hot plug connection. A blade server connected to backplane is referred to in this specification as 'installed.'

In the example of FIG. 1, the blade server chassis includes a receiving space (116). The receiving space (116) is a region in the blade server chassis (100) in which users, system administrators or other blade server maintenance personnel, install blade servers (102). Receiving space dividers (118) in the example of FIG. 1 separate the receiving space into two or more blade server regions (120) for receiving blade servers, each blade server region (120) receiving one blade server (102). The receiving space dividers (118) mount to a chassis bottom (122) inside the blade server chassis (100), the chassis bottom (122) defining a lower plane of the receiving space (116). The receiving space dividers (118) are spaced apart in parallel to receive a blade server (102) between the receiving space dividers (118). The receiving space dividers (118) extend from a front face (114) of the blade server chassis to the back of the receiving space (116).

A blade server (102) is a minimally-packaged computer motherboard that includes one or more computer processors, computer memory, storage, and network interface modules. The blade server (102) is a hot-swappable computer device that connects with backplane (124) through a hot plug connection. The hot-swap capability allows blade server maintenance personnel to remove from the blade server chassis (100) without turning off the electrical power provided by the power supply modules. The blade server (102) provides scalable computer resources in a computer network environment. Examples of blade servers (102) that may be improved according to embodiments of the present invention include the IBM eServer® BladeCenter™ HS20, the Intel® Server Compute Blade SBX82, the Dell™ PowerEdge 1855 Blade, and so on.

Blade server (102) includes an access panel (106) that is removably fastened to a vertical side (112) of blade server (102). Access panel (106) provides blade server maintenance personnel access to blade server components (110), such as processors, memory, storage, network interface modules, and so on, installed in blade server (102). To access blade server components through the access panel (106), blade server maintenance personnel slide the blade server (102) substantially outside the blade server chassis (100) and remove the access panel (106). Readers skilled in the art will recognize that the access panel (106) of FIG. 1 is for example only, and not for limitation. Blade servers (102) according to embodiments of the present invention may also leave blade server components (110) exposed without enclosing blade server components (110) behind access panel (106).

The support assembly (104) is a hardware device for maintaining a blade server (102) installed in a blade server chassis (100). The support assembly (104) connects with the blade server chassis (100) and with the blade server (102) so as to support the blade server (102) substantially outside the blade server chassis (100). Supporting the blade server (102) substantially outside the blade server chassis (102) allows blade server maintenance personnel convenient access to the blade server (102) for performing routine maintenance such as, for example, swapping out a blade server's computer processor, installing more computer memory on a blade, replacing a blade server in the blade server chassis with a new blade server, and so on.

Figure 2:
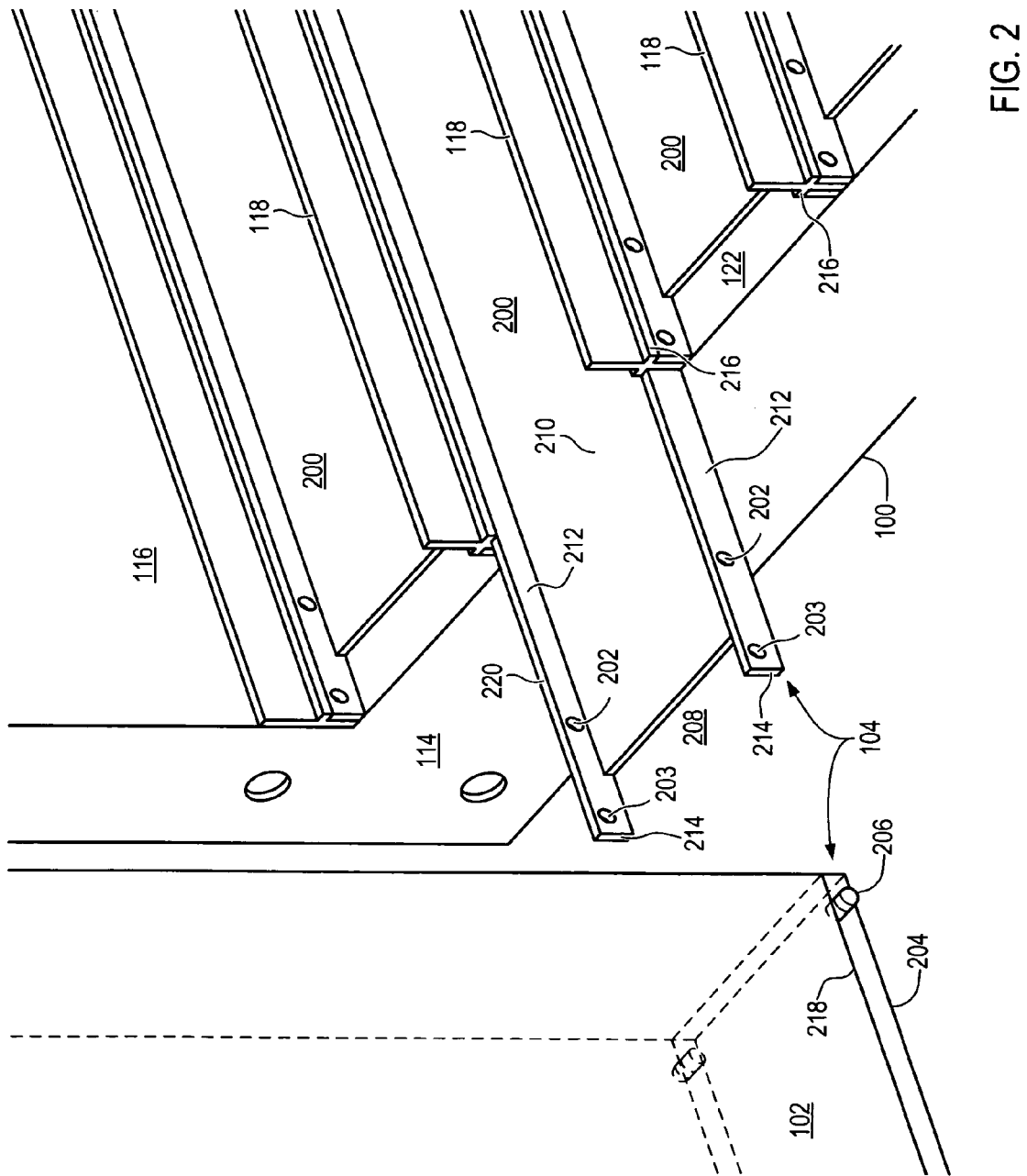
FIG. 2 sets forth a perspective view of a further exemplary blade server assembly according to embodiments of the present invention.

For further explanation, FIG. 2 sets forth a perspective view of a further exemplary blade server assembly according to embodiments of the present invention. The example of FIG. 2 includes a blade server chassis (100), a blade server (102), and a support assembly (104) connected with the blade server chassis and with the blade server so as to support the blade server substantially outside the blade server chassis.

In the example of FIG. 2, the support assembly (104) includes a lower slide track (200). The lower slide track (200) has a slide track base (210) that is substantially greater in width than height. A lateral slide track rail (212) of the lower slide track (200) fastens to each side of the slide track base (210) to form a recess between the lateral slide track rails for receiving an upper slide track (204). The distance between the lateral slide track rails (212) on each side of the slide track base (210) conforms to the width of the blade server (102). The slide track base (210) and the lateral slide track rails (212) extend into the receiving space (116) for a length sufficient to accommodate the length of the blade server (102).

The lower slide track (200) in the example of FIG. 2 connects to the blade server chassis (100) along the chassis bottom (122) that forms a lower plane of the receiving space (116). In the example of FIG. 2, support rails (216) guide the lower slide track (200) as the lower slide track (200) slides along the chassis bottom (122) and provides vertical support for the lower slide track (200) when extended from the receiving space (116). The support rails (216) mount on receiving space dividers (118) parallel to and above the lateral slide track rails (212). The support rails (216) may extend in length along the receiving space dividers (118) for a length similar to the length of lateral slide track rails (212). Although the example of FIG. 2 depicts a lower slide track (200) that slideably connects to the blade server chassis (100), such a connection is for example only, not for limitation. The lower slide track (200) may also connect to the blade server chassis (100) using a fixed connection that allows the lower slide track (200) to slightly protrude from the receiving space (116).

The lower slide track (200) in the example of FIG. 2 also includes a pair of first receiving holes (202) and a pair of second receiving holes (203). The pair of first receiving holes (202) and the pair of second receiving holes (203) extend through the pair of lateral slide track rails (212), each lateral slide track rail (212) containing a first receiving hole (202) and a second receiving hole (203). The pair of second receiving holes (203) is located directly behind front surfaces (214) of the lateral slide track rails (212), while the pair of first receiving holes (202) is located above slide track base (210) behind the pair of second receiving holes (203).

The lower slide track (200) in the example of FIG. 2 also includes a slot (208) through the slide track base (210) between the pair of second receiving holes (203). The slot (208) extends in width the distance between the pair of second receiving holes (203). The slot (208) extends in length from between the pair of first receiving holes (202) and the pair of second receiving holes (203) to the front surfaces (214) of the lateral slide track rails (212).

In the example of FIG. 2, the support assembly (104) includes an upper slide track (204) that slides along lower slide track (200) to install the blade server (102) into the blade server chassis (100). In the example of FIG. 2, the upper slide track (204) connects to the blade server (102) along the bottom surface (218) of the blade server (102). The width and length of the upper slide track (204) conforms to the width and length of the bottom surface (218) of the blade server (102). The height of the upper slide track (204) in the example of FIG. 2 is the distance from the slide track base (210) to the top edge (220) of the lateral slide track rails (212).

In the example of FIG. 2, the support assembly (104) also includes two hinge pins (206) along the back of the upper slide track (204). The hinge pins (206) are inset along a common axis on opposite sides of the upper slide track (204). The hinge pins compress along the common axis so as to engage the pair of first receiving holes (202) and support the blade server (102) on the slide track base (210) as a cantilever substantially outside the blade server chassis (100). The hinge pins also compress along the common axis so as to engage the pair of second receiving holes (203) and pivot the blade server (102) substantially outside the blade server chassis (100).

Figure 3:
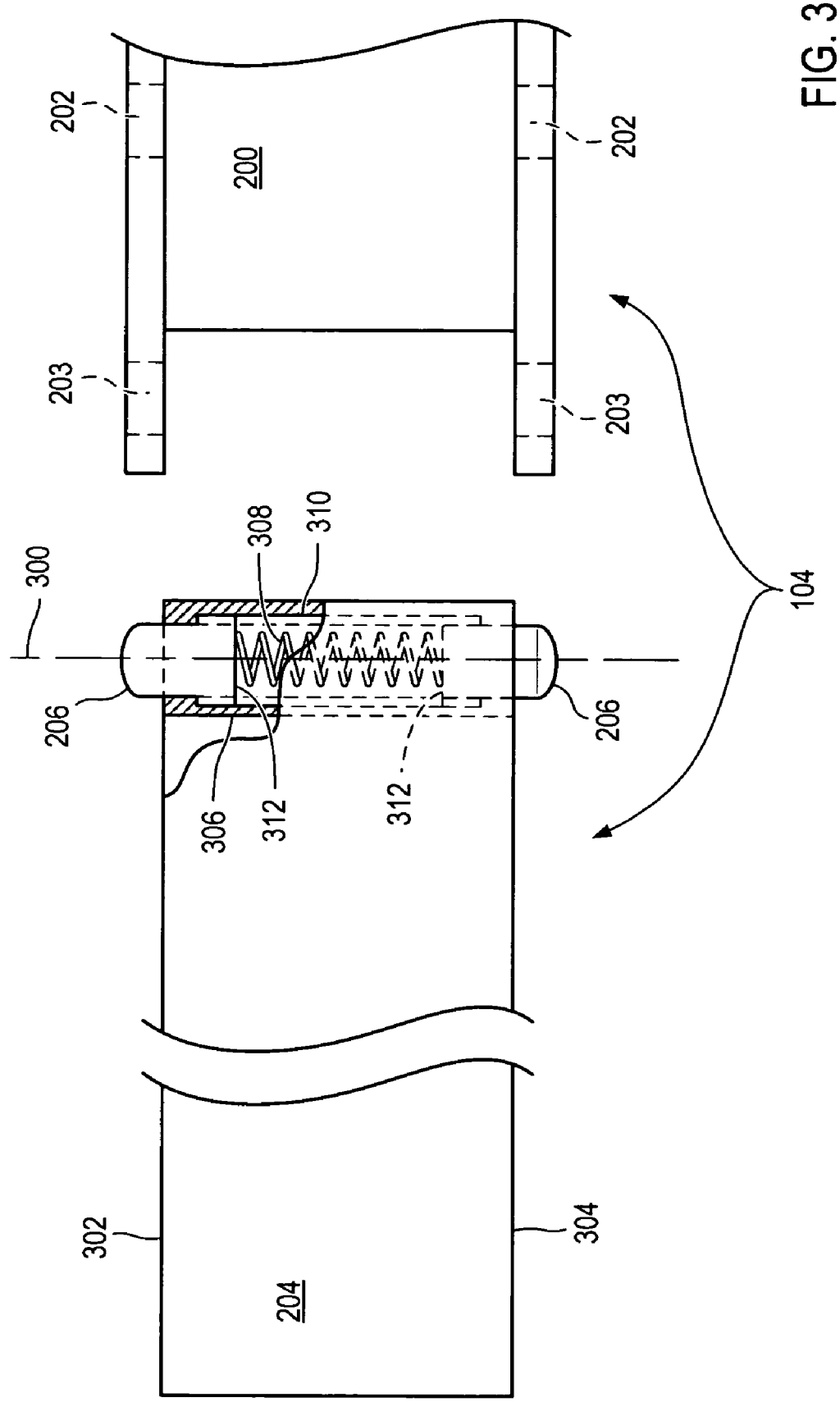
FIG. 3 sets forth a plan bottom view of an exemplary support assembly according to embodiments of the present invention.

For further explanation of the hinge pins (206), FIG. 3 sets forth a plan bottom view of an exemplary support assembly (104) that connects with the blade server chassis and with the blade server so as to support the blade server substantially outside the blade server chassis according to embodiments of the present invention. The support assembly (104) in the example of FIG. 3 includes an upper slide track (204), hinge pins (206), and lower slide track (200) that are similar in structure to the upper slide track (204), hinge pins (206), and lower slide track (200) described with reference to FIG. 2.

In the example of FIG. 3, the support assembly (104) includes two hinge pins (206) along the back of the upper slide track (204). The hinge pins (206) are inset along a common axis (300) on opposite sides (302 and 304) of the upper slide track (204). The hinge pins are compressible along the common axis (300) so as to engage the pair of first receiving holes (202) and support the blade server (102) on the slide track base (210) as a cantilever substantially outside the blade server chassis (100). The hinge pins also are compressible along the common axis (300) so as to engage the pair of second receiving holes (203) and pivot the blade server substantially outside the blade server chassis (100)

In the example of FIG. 3, the support assembly (104) also includes a hinge pin casing (306). The hinge pin casing (306) supports the two hinge pins (206) inset along a common axis (300) on opposite sides (302 and 304) of the upper slide track (204). The hinge pins (206) slideably connect to a surface (310) formed by the hinge pin casing (306). The casing (306) and hinge pins (206) are adapted to allow the hinge pins (206) to extend from the casing (306) while preventing the hinge pins from sliding all the way out of the casing (306).

In the example of FIG. 3, the support assembly (104) also includes a spring (308). The spring (308) presses on the surfaces (312) of hinge pins (206) inside the hinge pin casing (306). The spring (308) causes the hinge pins (206) to extend out of the upper slide track (204) as a far as the slideable connection between the hinge pin (206) and the hinge pin casing (306) permit. The hinge pins are compressible along the common axis (300) such that applying pressure to the outside of the hinge pin (206) along the common axis (300) causes the spring (308) to compress and displaces the hinge pins (206) along the common axis (300) inside the hinge pin casing (306). Releasing pressure on the outside of the hinge pin (206) along the common axis (300) causes the spring (308) to decompress and returns the hinge pins (206) to a fully extended position protruding from the upper slide track (204).

Figure 4:
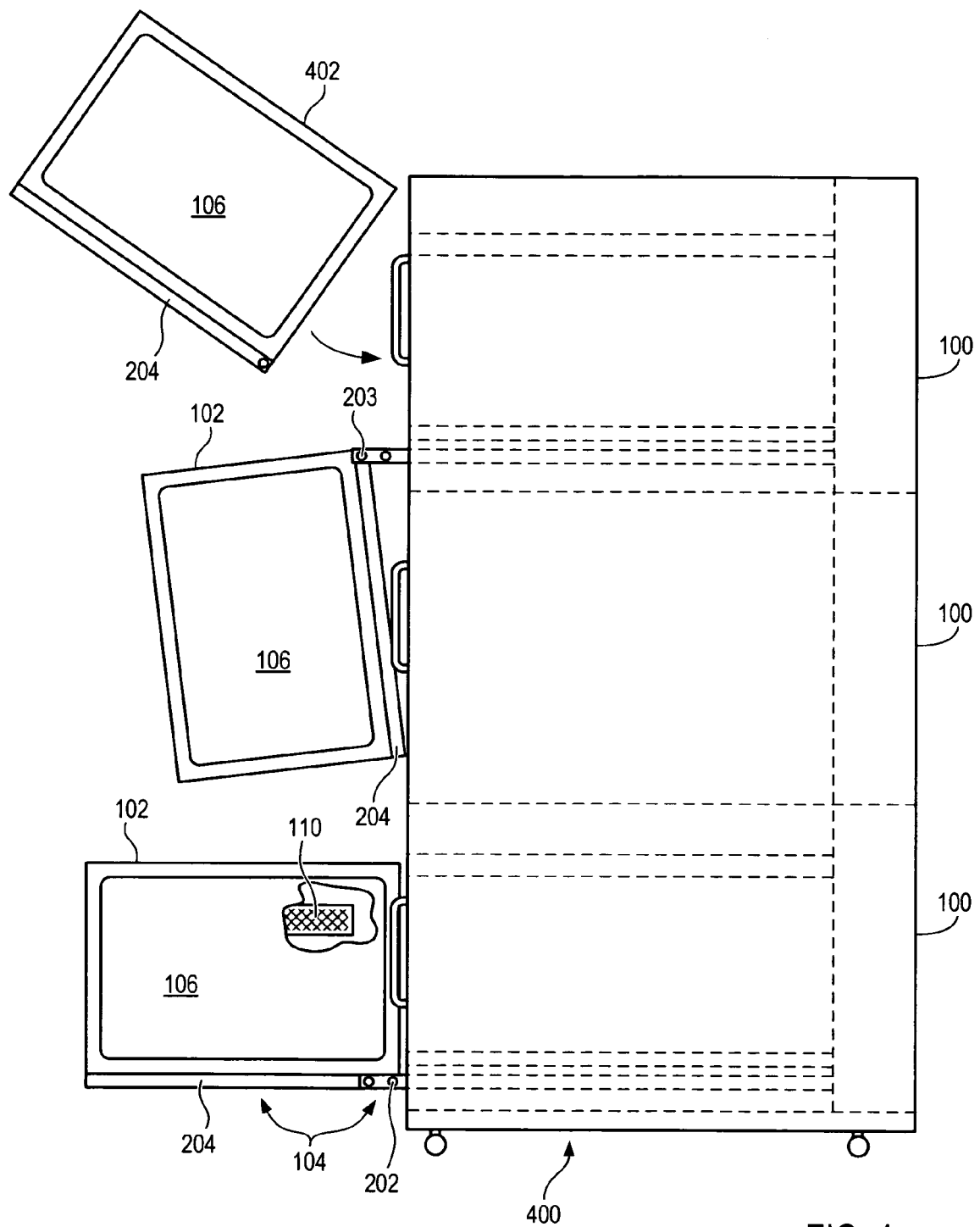
FIG. 4 sets forth a plan side view of a further exemplary blade server assembly according to embodiments of the present invention installed in a server rack.

For further explanation, FIG. 4 sets forth a plan side view of a further exemplary blade server assembly according to embodiments of the present invention installed in a server rack (400). The example of FIG. 4 includes a blade server chassis (100), a blade server (102), and a support assembly (104), which is connected with the blade server chassis and with the blade server so as to support the blade server substantially outside the blade server chassis, that are similar in structure to the blade server chassis (100), the blade server (102), and the support assembly (104) described with reference to FIGS. 2 and 3.

The example of FIG. 4 also includes a server rack (400). The server rack (400) is a hardware system for mounting various computer hardware modules in a 'stack' or a 'rack.' Computer hardware modules may include, for example, rack servers, rack switches, or blade server chassis. The server rack (400) in the example of FIG. 4 provides blade server maintenance personnel a single location for operating and maintaining a large number of blade servers (102).

Blade server maintenance personnel use the blade server assemblies depicted in the example of FIG. 4 to maintain blade servers (102) installed in each blade server chassis (100). Blade server maintenance personnel maintain the blade server (102) by supporting the blade server (102) substantially outside the blade server chassis (100) through a support assembly (104) connected with the blade server chassis (100) and with the blade server (102). Blade server maintenance personnel may support the blade server (102) substantially outside the blade server chassis (100) by sliding the blade server (102) out of the blade server chassis (100) until the hinge pins engage the pair of first receiving holes (202).

When the hinge pins engage the pair of first receiving holes (202), supporting the blade server (102) may continue as the support assembly (104) supports the blade server (102) on the slide track base as a cantilever substantially outside the blade server chassis (100) as depicted by the blade server (102) in the bottom of the server rack (400) in the example of FIG. 4. While the support assembly (104) supports the blade server (102) as a cantilever, blade server maintenance personnel may perform maintenance on the blade server with no need to awkwardly balance the blade server on a knee, place the blade server on the floor, or inconveniently place the blade server on a table across the room or even in some other room. After removing access panel (106) to expose blade server components (110), blade server maintenance personnel may, for example, swap out a blade server's computer processor, install more computer memory on a blade, replace daughter cards connected to the motherboard, and so on.

Blade server maintenance personnel may also support the blade server (102) substantially outside the blade server chassis (100) by sliding the blade server (102) out of the blade server chassis (100) until the hinge pins engage the pair of second receiving holes (203). When the hinge pins engage the pair of second receiving holes (202), supporting the blade server (102) may continue as blade server maintenance personnel pivot the blade server (102) substantially outside the blade server chassis (100) as depicted by the blade server (102) in the top of the server rack (400) in the example of FIG. 4. Pivoting the blade server (102) allows blade server maintenance personnel to more easily maintain blade servers installed in a chassis located at the top of rack (400). After pivoting the blade server (102), blade server maintenance personnel may perform maintenance on the blade server with no need to awkwardly balance the blade server on a knee, place the blade server on the floor, or inconveniently place the blade server on a table across the room or even in some other room.

When blade server maintenance personnel install a replacement blade server (402) in the chassis (100) using the support assembly depicted in the example of FIG. 4, blade server maintenance personnel may support the blade server (102) by sliding the blade server (102) out of the blade server chassis (100) until the hinge pins engage the pair of second receiving holes (203). When the hinge pins engage the pair of second receiving holes (202), supporting the blade server (102) continues as blade server maintenance personnel pivot the blade server (102) substantially outside the blade server chassis (100) as depicted by the blade server (102) in the top of the server rack (400) in the example of FIG. 4. While pivoted substantially outside the blade server chassis (100), blade server maintenance personnel may insert the replacement (402) blade server in the blade server chassis (100) with no need to awkwardly balance the blade servers (102 and 402) on a knee, place the blade server (102 and 402) on the floor, or inconveniently place the blade server (102 and 402) on a table across the room or even in some other room.

Figure 5:
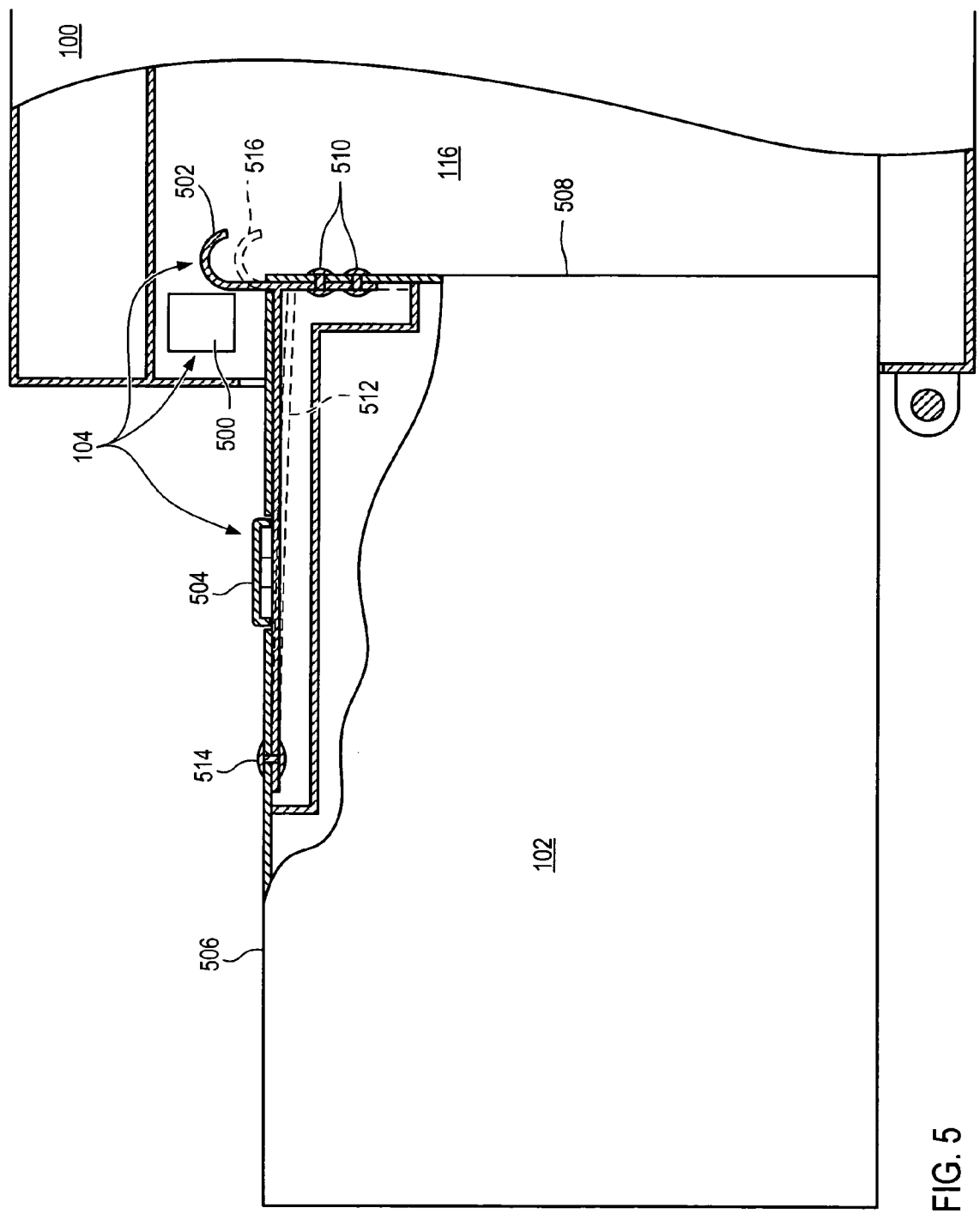
FIG. 5 sets forth a plan side view of a further exemplary support assembly according to embodiments of the present invention.

For further explanation, FIG. 5 sets forth a plan side view of a further exemplary support assembly (104) according to embodiments of the present invention. The support assembly (104), which is connected with the blade server chassis and with the blade server so as to support the blade server substantially outside the blade server chassis according to the example of FIG. 5, includes a detent (500), a movable hook (502), and a release (504).

In the example of FIG. 5, the detent (500) mounts inside the blade server chassis (100) above a top surface (506) of the blade server (102). The detent (500) in the example of FIG. 5 is a horizontal rail that spans the width of the receiving space (116). Each end of the detent (500) fastens to the blade server chassis (100) at a height above the top surface (506) of blade server (102) such that the moveable hook (502) engages the detent (500) when blade server maintenance personnel extend the blade server (102) from the blade server chassis (100). The example of FIG. 5 depicts the detent (500) as a horizontal rail for explanation, and not for limitation. The detent (500) in the example of FIG. 5 may include a plate, a notch, a block, or any other structure adapted to engage the moveable hook (502) as will occur to those of skill in the art.

In the example of FIG. 5, the movable hook (502) connects to the blade server (102) so as to engage the detent (500) and support the blade server on the detent (500) as a cantilever substantially outside the blade server chassis. The movable hook (502) slideably fastens to the back surface (508) of the blade server (102) using fasteners (510) and slides vertically along the inside of back surface (508) to raise and lower the moveable hook (502). In a raised position, the moveable hook (502) extends above the top surface (506) to engage the detent (500) when blade server maintenance personnel extend the blade server (102) from the blade server chassis (100). In a lowered position (516), the moveable hook (502) does not engage the detent (500) when blade server maintenance personnel extend the blade server (102) from the blade server chassis (100). The lowered position (516) allows blade server maintenance personnel to remove the blade server (102) from the blade server chassis (100).

In the example of FIG. 5, the release (504) mounts on the blade server (102) so as to disengage the moveable hook (502) from the detent (500). The release (504) in the example of FIG. 5 is a button in the top surface (506) of the blade server (102). The release (504) fastens to a flat spring (512). One end of the flat spring (512) mounts to the top surface (506) of the blade server (102) by fastener (514), while the other end of the flat spring (512) mounts on the moveable hook (502). Applying downward pressure on the release (504) lowers flat spring (512) and moveable hook (502). Releasing downward pressure on the release (504) returns flat spring (512) and moveable hook (502) to a raised position.

Blade server maintenance personnel use the support assembly (104) depicted in the example of FIG. 5 to maintain the blade server (102) installed in the blade server chassis (100). Blade server maintenance personnel maintain the blade server (102) by supporting the blade server (102) substantially outside the blade server chassis (100) through a support assembly (104) connected with the blade server chassis (100) and with the blade server (102). Blade server maintenance personnel may support the blade server (102) substantially outside the blade server chassis (100) by sliding the blade server (102) out of the blade server chassis (100) until the movable hook (502) engages the detent (500).

When the moveable hook (502) engages the detent (500), supporting the blade server (102) continues by the support assembly (104) supporting the blade server (102) on the detent (500) as a cantilever substantially outside the blade server chassis (100) as depicted by the blade server (102) in the example of FIG. 5. While the support assembly (104) supports the blade server (102) as a cantilever, blade server maintenance personnel may perform maintenance on the blade server with no need to awkwardly balance the blade server on a knee, place the blade server on the floor, or inconveniently place the blade server on a table across the room or even in some other room. After removing access panel (106) to expose blade server components (110), blade server maintenance personnel may, for example, swap out a blade server's computer processor, install more computer memory on a blade, replace daughter cards connected to the motherboard, and so on.

When blade server maintenance personnel install a new blade server in the chassis (100) using the support assembly (104) depicted in the example of FIG. 5, blade server maintenance personnel may disengage the moveable hook (502) from the detent (500). Blade server maintenance personnel may disengage the moveable hook (502) from the detent (500) by applying downward pressure on the release (504) and removing the blade server (102) from the blade server chassis (100). When the blade server (102) is removed from the blade server chassis (100), blade server maintenance personnel may insert a new blade server into the blade server chassis (100).

Figure 6:
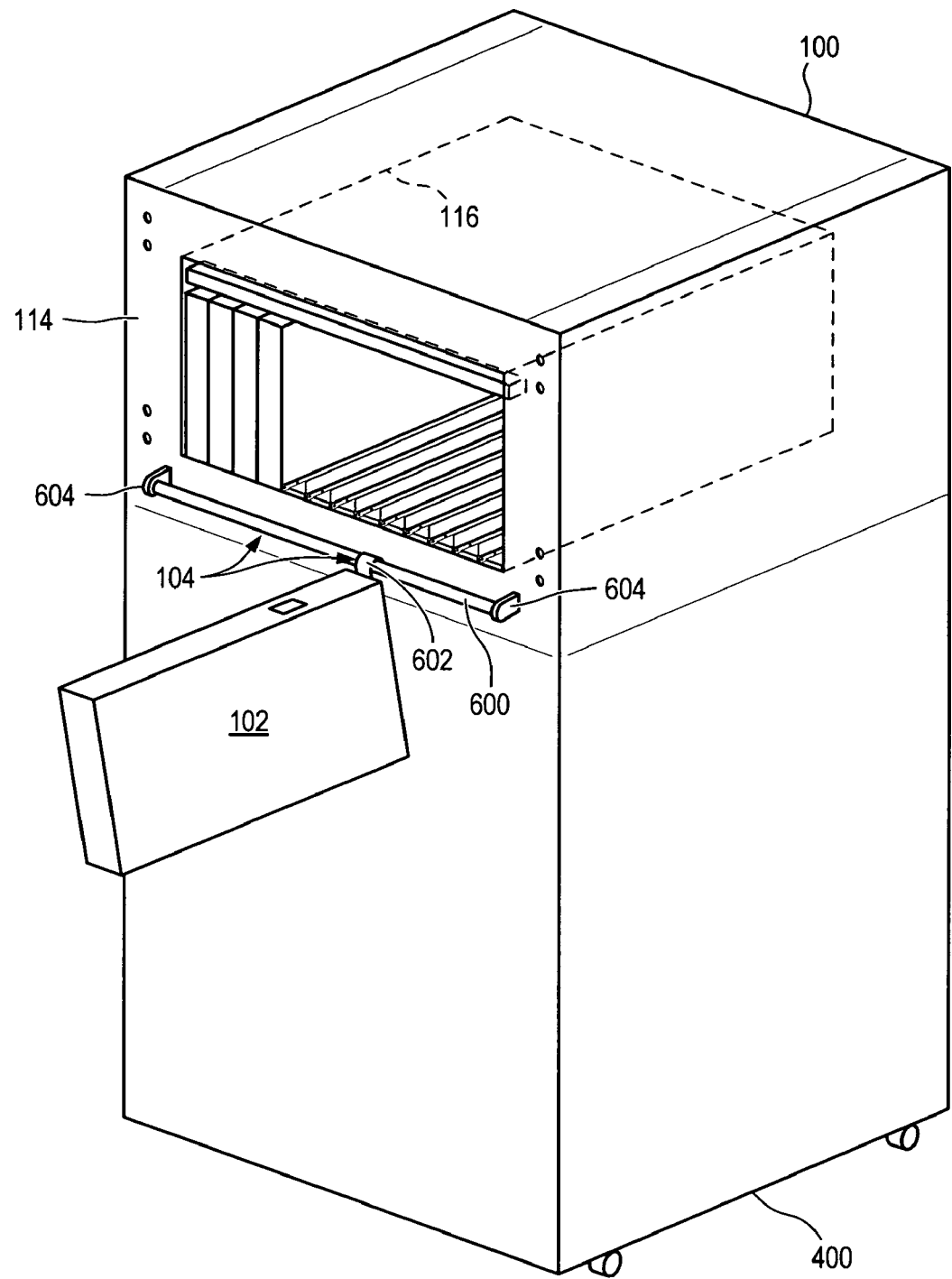
FIG. 6 sets forth a perspective view of a further exemplary blade server assembly according to embodiments of the present invention installed in a server rack.

For further explanation, FIG. 6 sets forth a perspective view of a further exemplary blade server assembly according to embodiments of the present invention installed in a server rack (400). The example of FIG. 6 includes a blade server chassis (100), a blade server (102), and a support assembly (104) connected with the blade server chassis (100) and with the blade server (102) so as to support the blade server (102) substantially outside the blade server chassis (100). The support assembly (104) includes a horizontal rail (600) and a hook (602).

In the example of FIG. 6, the horizontal rail (600) mounts on the blade server chassis (100) by brackets (604). Brackets (604) in the example of FIG. 6 mount on the front face (114) of the blade server chassis (100) below the receiving space (116). The brackets (604) are spaced apart by a width that conforms to the width of the receiving space (116). The horizontal rail (600) spans across the front face (114) of the blade server chassis (100), and each end of the horizontal rail (600) fastens to a bracket (604). In the example of FIG. 6, the horizontal rail (600) and brackets (604) support the weight all the blade servers (102) that blade server maintenance personnel may install in the blade server chassis (100).

In the example of FIG. 6, the hook (602) mounts to the blade server (102) so as to hang the blade server on the horizontal rail substantially outside the blade server chassis. The hook (602) is similar in structure to the moveable hook (502) in the example of FIG. 5. As discussed above, the example of FIG. 5 depicts the moveable hook (502) as slideably fastened to the back surface of the blade server (102). In the example of FIG. 6, a slideable connection between the hook (602) and the blade server (102) is for explanation and not for limitation. The hook (602) may also fasten to blade server (102) in a fixed position.

Blade server maintenance personnel use the blade server assembly as depicted in the example of FIG. 6 to maintain the blade server (102) installed in the blade server chassis (100). Blade server maintenance personnel maintain the blade server (102) by supporting the blade server (102) substantially outside the blade server chassis (100) through a support assembly (104) connected with the blade server chassis (100) and with the blade server (102). Blade server maintenance personnel support the blade server (102) substantially outside the blade server chassis (100) by sliding the blade server (102) out of the blade server chassis (100) and hanging the hook (602) on the horizontal rail (600) substantially outside the blade server chassis (100). While hanging the blade server (102) on the hook (602), blade server maintenance personnel may perform maintenance on the blade server with no need to awkwardly balance the blade server on a knee, place the blade server on the floor, or inconveniently place the blade server on a table across the room or even in some other room. After supporting the blade server (102) substantially outside the blade server chassis (100), blade server maintenance personnel may remove access panel (106) to expose blade server components (110) and perform routine maintenance on the blade server (102) such as, for example, swapping out a blade server's computer processor, installing more computer memory on a blade, replacing daughter cards connected to the motherboard, replacing the blade server (102) with a replacement blade server, and so on.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method for maintaining a blade server installed in a blade server chassis, the method comprising supporting the blade server substantially outside the blade server chassis through a support assembly connected with the blade server chassis and with the blade server wherein the support assembly further comprises:
   a lower slide track connected to the blade server chassis, the lower slide track having a pair of first receiving holes and a slide track base;
   an upper slide track connected to the blade server; and
   two hinge pins, the hinge pins inset along a common axis on opposite sides of the upper slide track, the hinge pins compressible along the common axis; and
   supporting the blade server further comprises:
   sliding the blade server out of the blade server chassis until the hinge pins engage the pair of first receiving holes; and
   supporting the blade server on the slide track base as a cantilever substantially outside the blade server chassis.

2. A method for maintaining a blade server installed in a blade server chassis, the method comprising supporting the blade server substantially outside the blade server chassis through a support assembly connected with the blade server chassis and with the blade server wherein the support assembly further comprises:
   a lower slide track connected to the blade server chassis, the lower slide track having a pair of second receiving holes, a slide track base, and a slot through the slide track base between the pair of second receiving holes;
   an upper slide track connected to the blade server; and
   two hinge pins, the hinge pins inset along a common axis on opposite sides of the upper slide track, the hinge pins compressible along the common axis; and
   supporting the blade server further comprises:
   sliding the blade server out of the blade server chassis until the hinge pins engage the pair of second receiving holes; and
   pivoting the blade server substantially outside the blade server chassis.

3. A method for maintaining a blade server installed in a blade server chassis, the method comprising supporting the blade server substantially outside the blade server chassis through a support assembly connected with the blade server chassis and with the blade server wherein the support assembly further comprises:
   a detent mounted inside the blade server chassis above a top surface of the blade server;
   a movable hook connected to the blade server; and
   a release mounted on the blade server; and
   supporting the blade server further comprises:
   sliding the blade server out of the blade server chassis until the movable hook engages the detent;
   supporting the blade server on the dent as a cantilever substantially outside the blade server chassis; and
   disengaging the moveable hook from the detent.

* * * * *